(12) United States Patent
Chen et al.

(10) Patent No.: US 12,363,920 B2
(45) Date of Patent: Jul. 15, 2025

(54) METHODS FOR MEASURING A MAGNETIC CORE LAYER PROFILE IN AN INTEGRATED CIRCUIT

(71) Applicant: Taiwan Semiconductor Manufacturing Company Limited, Hsinchu (TW)

(72) Inventors: W. C. Chen, Hsinchu (TW); T. C. Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 608 days.

(21) Appl. No.: 17/706,715

(22) Filed: Mar. 29, 2022

(65) Prior Publication Data

US 2023/0026359 A1    Jan. 26, 2023

Related U.S. Application Data

(60) Provisional application No. 63/222,054, filed on Jul. 15, 2021.

(51) Int. Cl.
*H10D 1/20* (2025.01)
*H01F 17/00* (2006.01)
(Continued)

(52) U.S. Cl.
CPC .......... *H10D 1/20* (2025.01); *H01F 17/0013* (2013.01); *H01F 41/042* (2013.01); *H01L 22/20* (2013.01); *G01B 5/06* (2013.01); *G01B 5/066* (2013.01); *G01B 7/066* (2013.01); *G01B 7/105* (2013.01); *H01L 24/05* (2013.01); *H01L 24/06* (2013.01); *H01L 2224/05082* (2013.01); *H01L 2224/05124* (2013.01); *H01L 2224/05147* (2013.01); *H01L 2224/05186* (2013.01); *H01L 2224/05647* (2013.01); *H01L 2224/05655* (2013.01); *H01L 2224/05666* (2013.01); *H01L 2224/06155* (2013.01); *H01L 2924/04541* (2013.01); *H01L 2924/0455* (2013.01);
(Continued)

(58) Field of Classification Search
CPC ..... H01L 28/10; H01L 22/20; H01F 17/0013; H01F 41/042; G01B 5/06; G01B 5/066; G01B 7/066; G01B 7/105
See application file for complete search history.

(56) References Cited

U.S. PATENT DOCUMENTS

2020/0111609 A1*  4/2020 Sato .................. H01F 17/04

* cited by examiner

*Primary Examiner* — Joseph C. Nicely
(74) *Attorney, Agent, or Firm* — The Marbury Law Group, PLLC

(57) ABSTRACT

An inductive structure may be manufactured with in-situ characterization of dimensions by forming a metal line on a top surface of a semiconductor die, forming a passivation dielectric layer over the metal line, measuring a height profile of a top surface of the passivation dielectric layer as a function of a lateral displacement, forming a magnetic material plate over the passivation dielectric layer, measuring a height profile of a top surface of the magnetic material plate as a function of the lateral displacement, and determining a thickness profile of the magnetic material plate by subtracting the height profile of the top surface of the passivation dielectric layer from the height profile of the top surface of the magnetic material plate. An inductive structure including the magnetic material plate and the metal line is formed.

20 Claims, 13 Drawing Sheets

(51) Int. Cl.
    *H01F 41/04*           (2006.01)
    *H01L 21/66*           (2006.01)
    *G01B 5/06*            (2006.01)
    *G01B 7/06*            (2006.01)
    *H01L 23/00*           (2006.01)

(52) U.S. Cl.
    CPC ............... *H01L 2924/04563* (2013.01); *H01L 2924/04941* (2013.01); *H01L 2924/04953* (2013.01); *H01L 2924/0496* (2013.01)

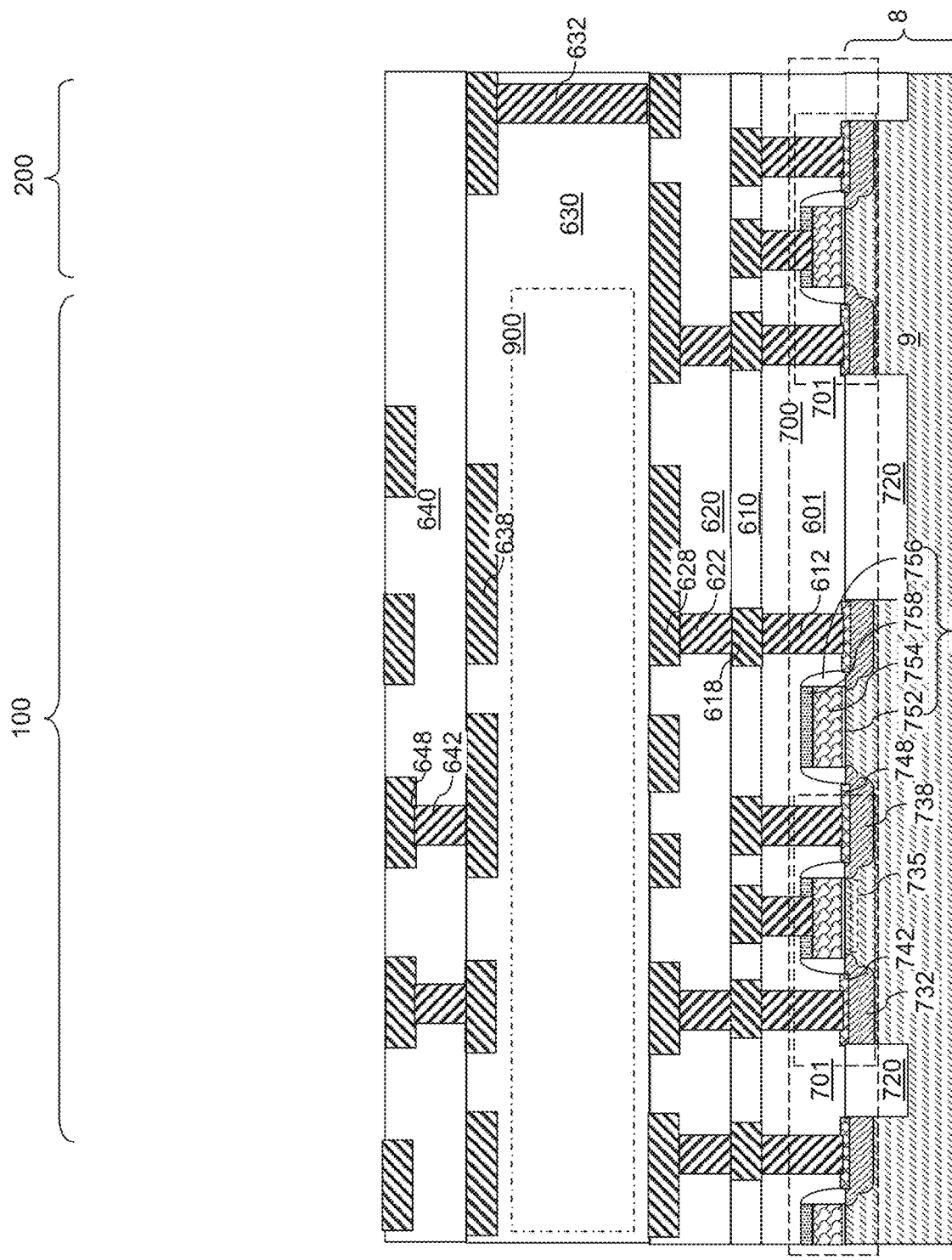

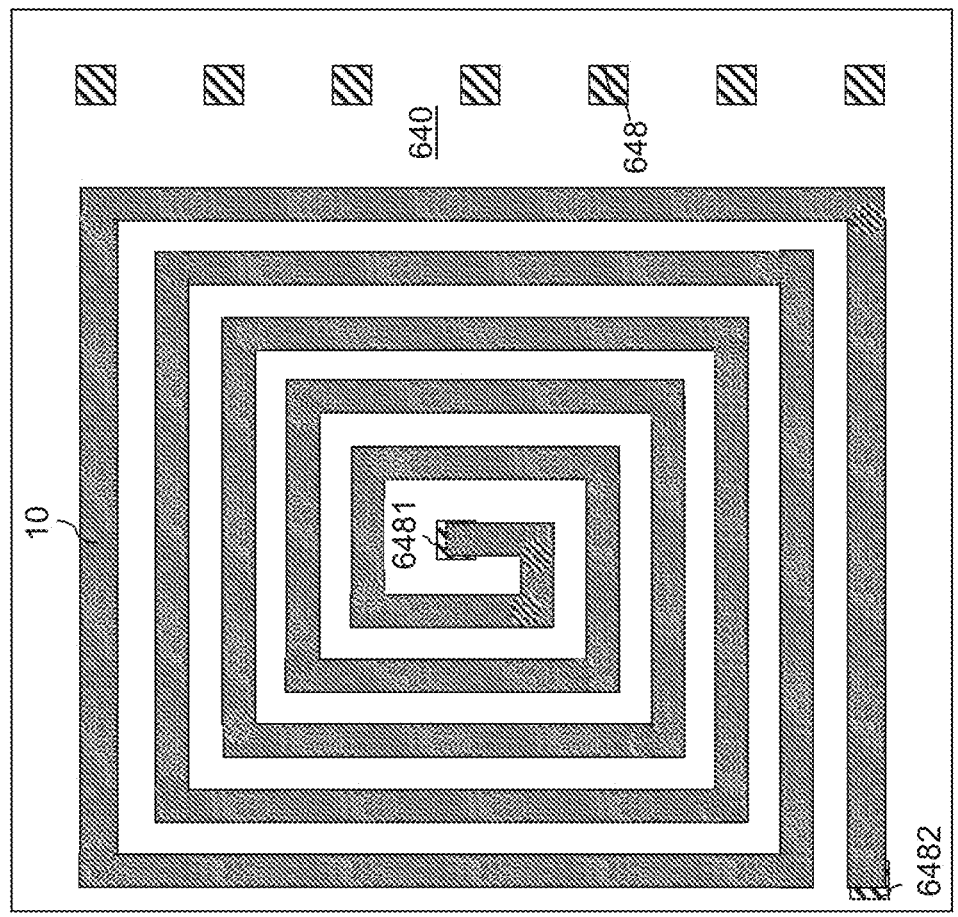
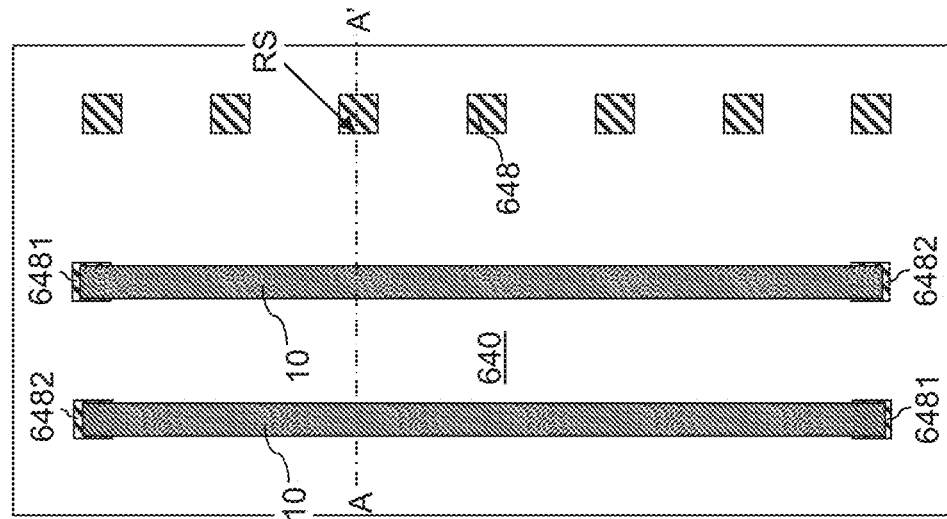
FIG. 3
FIG. 2B

METHODS FOR MEASURING A MAGNETIC CORE LAYER PROFILE IN AN INTEGRATED CIRCUIT

RELATED APPLICATIONS

This application claims the benefit of priority of a U.S. Provisional Application Ser. No. 63/222,054 titled "Method for Measuring CZT Stack Profile Thickness" and filed on Jul. 15, 2021, the entire contents of which are incorporated herein by reference.

BACKGROUND

An inductor is a device that generates a voltage that is proportional to the rate of change of electrical current flowing through the inductor. Inductors are used in radio-frequency identification (RFID) tags, voltage regulator modules, and various electronic circuits embedded in portable or non-portable devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a vertical cross-sectional view of an exemplary structure after formation of complementary metal-oxide-semiconductor (CMOS) transistors, dielectric material layers, and metal interconnect structures according to an embodiment of the present disclosure.

FIG. 2B is a top-down view of the region of the exemplary structure of FIG. 2A. The vertical plane A-A' is the plane of the vertical cross-sectional view of FIG. 2A.

FIG. 3 is a top-down view of an alternative exemplary structure at the processing steps of FIGS. 2A and 2B.

DETAILED DESCRIPTION

Figure 2A:
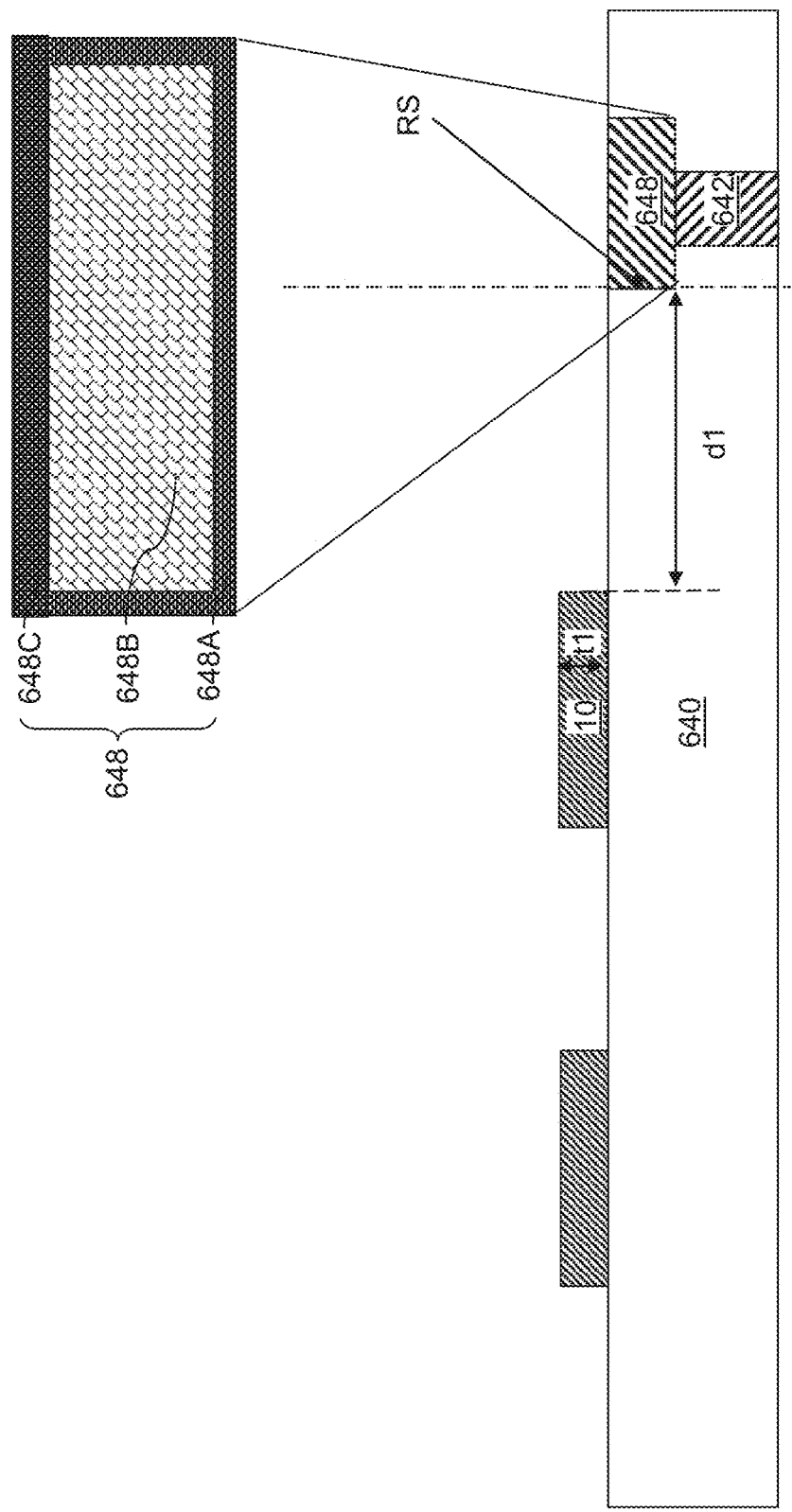
FIG. 2A is a vertical cross-sectional view of a region of the exemplary structure after formation of a metal line according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are located in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Inductive structures may be used as passive elements in semiconductor circuits provided in semiconductor dies. For example, inductive structures may be used as a component of an electromagnet structure within a voltage regulator circuit. Such an electromagnet structure can be formed under copper bumps. The voltage regulator may be incorporated into any semiconductor chip such as a central processing unit (CPU) die. Uneven profiles of magnetic material plates for inductive structures are difficult to measure by optical means. However, the thickness profile and the contour of magnetic material plates in inductive structures are crucial in estimating the inductance of the magnetic material plates. Methods of the present disclosure enable manufacture of uneven chip with cobalt-zirconium-tantalum (CZT) complex film. For example, the method enables manufacture of inductive structures with precise estimation of the thickness profile and the contour of magnetic material plates and underlying structures within the inductive structures. The inductance of the inductive structure may be estimated during manufacture of various components of the inductive structure, and components of the inductive structures may be formed with modified thicknesses and/or modified profiles to provide target inductance for the inductive structures. Various embodiment methods of the present disclosure may provide inductance quality control, including correlation after magnet anneal thermal expansion, for inductive structures that may be formed on semiconductor dies.

Referring to FIG. 1, an exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be located in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The exemplary structure may include a memory array region 100 containing an array 900 of memory cells (not expressly shown). The exemplary structure may further include a peripheral region 200 in which peripheral devices (such as word line drivers, bit line drivers, sense amplifiers, and power supply circuits) for the array 900 of memory cells are provided. In this embodiment, the field effect transistors 701 in the CMOS circuitry 700 may be electrically connected to an electrode of a respective memory cell by a respective set of metal interconnect structures. The devices in the peripheral region 200 may be configured to control the programming operation, the erase operation, and the sensing (read) operation of the array 900 of memory cells. For example, the devices in the peripheral region 200 may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures located within dielectric material layers are formed over the substrate 8 and the semiconductor devices thereupon (such as field effect transistors 701). In an illustrative example, the dielectric material layers may include lower-level dielectric material layers (601, 610, 620) located below a memory-level dielectric material layer (which may comprise, for example, a third interconnect-level dielectric material layer 630), and at least one upper-level dielectric material layer (such as a fourth interconnect-level dielectric material layer 640) located above the memory-level dielectric material layer 630. While the present disclosure is described using an embodiment in which the third interconnect-level dielectric material layer 630 comprises a memory-level dielectric material layer, embodiments are expressly contemplated herein in which the memory-level dielectric material layer is formed at different levels. Further, while the present disclosure is described using an embodiment in which only the fourth interconnect-level dielectric material layer 640 is located above the memory-level dielectric material layer, embodiments may be expressly contemplated in which two or more interconnect-level dielectric material layers are formed above the memory-level dielectric material layer.

The lower-level dielectric material layers (601, 610, 620) may include, for example, a first dielectric material layer 601 that is a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 located in the first dielectric material layer 601 and contacting a respective component of the CMOS circuitry 700, first metal line structures 618 located in the first interconnect-level dielectric material layer 610, first metal via structures 622 located in a lower portion of the second interconnect-level dielectric material layer 620, and second metal line structures 628 located in an upper portion of the second interconnect-level dielectric material layer 620.

Second metal via structures 632 and third metal line structures 638 may be located within the memory-level dielectric material layer. A topmost dielectric material layer within the at least one upper-level dielectric material layer may comprise a pad-level dielectric material layer including an array of metal pads 648. For example, the fourth interconnect-level dielectric material layer 640 may comprise an array of metal pads 648 and discrete metal pads 648. Each metal pad 648 may be connected to a respective underlying metal interconnect structure by a respective metal via structure, such as a respective third metal via structure 642. The array of metal pads 648 may be configured to accommodate an array of metal bumps (such as an array of copper bumps) to be subsequently formed thereupon. The discrete metal pads 648 may be configured to be electrically connected to end portions of a respective metal line (such as a metal line of an inductive structure) to be subsequently formed thereupon. As used herein, an inductive structure refers to a structure configured to generate a voltage that is proportional to a rate of change of electrical current that flows therethrough, i.e., an inductor.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, a contiguous combination of a metal via structure and an overlying metal line structure may be formed as integrated line and via structures by a dual damascene process.

Referring to FIGS. 2A and 2B, a region of the exemplary structure is illustrated, which includes a portion of an area in which an inductive structure may be formed and an area of a metal pad 648 over which a metal bump structure may be subsequently formed. An exemplary configuration of the metal pad 648 is illustrated in detail in an inset in FIG. 2A. In this illustrated example, the metal pad 648 may comprise a pad-level metallic liner 648A, a pad-level metallic fill material portion 648B, and a pad-level metallic cap 648C. The pad-level metallic liner 648A may comprise, for example, TiN, TaN, WN, TiC, TaC, and WC, and may have a thickness in a range from 3 nm to 60 nm. The pad-level metallic fill material portion 648B may comprise copper or aluminum at an atomic percentage greater than 95%, such as greater than 99%. The pad-level metallic cap 648C may comprise any material or any material stack that may be used as an underbump metallurgy (UBM) stack as known in the art. For example, the pad-level metallic cap 648C may comprise a titanium-copper alloy layer, a titanium-nickel-copper alloy layer, or a stack including a titanium layer, a nickel layer, and/or a copper layer. Other suitable metallic cap materials are within the contemplated scope of disclosure.

According to an aspect of the present disclosure, a highly conductive metal such as copper or aluminum may be deposited over a planar top surface of the pad-level dielectric material layer (such as the fourth interconnect-level dielectric material layer 640 in the illustrated example) by a conformal or non-conformal deposition process. The highly conductive metal may be deposited by physical vapor deposition, chemical vapor deposition, electroplating, and/or combination thereof. A metal layer may be formed above the pad-level dielectric material layer. The thickness of the metal layer may be in a range from 5 microns to 40 microns, such as from 10 microns to 30 microns and/or from 15 microns to 25 microns, although lesser and greater thicknesses may also be used.

A photoresist layer (not shown) may be applied over the metal layer, and may be lithographically patterned into at least one line pattern including at least one straight line segment 10. Each line pattern of the patterned photoresist layer may consist of a single straight line segment, or may comprise a plurality of line segments having different lateral propagation directions (which are herein referred to lengthwise directions of a respective line segment). In one embodiment, at least one, a plurality, and/or each of the at least one line segment of the patterned photoresist layer may have a length-to-width ratio that is at least 5, 10, and/or 20. In other words, at least one, a plurality, and/or each of the at least one line segment 10 of the patterned photoresist layer may have a respective length that is at least 5 times, 10 times, and/or 20 times, a width of the respective line segment.

An etch process may be performed to remove portions of the metal layer that are not covered by the patterned photoresist layer. The etch process may comprise an anisotropic etch process such as a reactive ion etch process, or an isotropic etch process such as a wet etch process. Remaining portions of the metal layer comprise at least one metal line 10. Each metal line 10 may consist of a single straight line segment, or may comprise a plurality of line segments having a same lateral propagation direction or having different lateral propagation directions. In one embodiment, at least one, a plurality, and/or each of the at least one metal line 10 may have a length-to-width ratio that is at least 5, 10, and/or 20. In other words, at least one, a plurality, and/or each of the at least one metal line 10 may have a respective length that is at least 5 times, 10 times, and/or 20 times, a width of the respective line segment. The width of each metal line 10 may be in a range from 100 nm to 5 microns, such as from 300 nm to 3 microns, although lesser and greater widths may also be employed.

Referring to FIG. 3, an alternative exemplary structure is illustrated at the processing steps of FIGS. 2A and 2B. Generally, each metal line 10 may be formed in any configuration that may be used a conductive line in an inductive structure. In the illustrated example of FIG. 3, the metal line 10 may be formed in a spiral pattern including a plurality of metal line segments.

Referring collectively to FIGS. 2A, 2B, and 3, at least one metal line 10 having a length that is at least 5 times a width of the respective metal line 10 may be formed on the planar top surface of the pad-level dielectric material layer (such as a fourth interconnect-level dielectric material layer 640 in the illustrated example of FIGS. 2A and 2B). Each metal line 10 may have a first endpoint 6481 and a second endpoint 6482. Each metal line 10 may have a first thickness t1, which is a nominal thickness (or an average thickness) of the metal line 10. The first thickness t1 may be in a range from 5 microns to 40 microns, such as from 10 microns to 30 microns and/or from 15 microns to 25 microns, although lesser and greater thicknesses may also be used. The width of each metal line 10 (such as the lateral dimension of the metal line 10 as illustrated in FIG. 2A) may be in a range from 10 microns to 60 microns, although lesser and greater widths may also be used. The lateral distance of a lengthwise sidewall of each metal line 10 may be measured from any reference structure, and is herein referred to as a first lateral distance d1. For example, the reference structure RS may comprise a sidewall of a metal pad 648, and the first lateral distance d1 may be a lateral distance between a proximal lengthwise sidewall of a metal line 10 and the metal pad 648. For example, the first lateral distance may be in a range from 20 microns to 200 microns.

Generally, a semiconductor die comprising a dielectric material layer (such as a pad-level dielectric material layer) embedding metal pads 648 may be provided. End portions of each metal line 10 are formed directly on top surfaces of two of the metal pads 648 such that both ends of the metal line 10 are electrically connected to a respective underlying set of metal interconnect structures and to a pair of electrical nodes within the CMOS circuitry 700 or passive devices (such as a capacitor, a resistor, or another inductor) within the semiconductor die. In one embodiment, a metal line 10 may comprise copper at an atomic percentage greater than 95%, and/or greater than 99%. In one embodiment, the metal line 10 may have a thickness in a range from 5 microns to 40 microns.

According to an aspect of the present disclosure, a height profile of a top surface of the metal line 10 is measured as a function of a lateral displacement from a reference structure (e.g., a proximal one of the metal pads 648). The reference structure may be any structure that may be easily identified by a measurement tool, for example, using a pattern recognition algorithm. In one embodiment, the reference structure may be provided on the top surface of the semiconductor die. In one embodiment, a metal pad 648 may be used as the reference structure.

Generally, the lateral displacement from the reference structure may be measured as a two-dimensional array of displacement vectors, or as a lateral distance (which is a scalar, i.e., a one-dimensional quantity) from the reference structure. In embodiments in which the lateral displacement from the reference structure is measured as a two-dimensional array of displacement vectors, the height profile of a top surface of the metal line 10 is generated as a two-dimensional array of heights of measured points of the top surface of the metal line 10. In embodiments in which the lateral displacement from the reference structure may be measured as a lateral distance from a reference structure on the top surface of the semiconductor die, the height profile of a top surface of the metal line 10 may be generated as a function of the lateral displacement as a one-dimensional array of heights of measured points of the top surface of the metal line 10.

Figure 4:
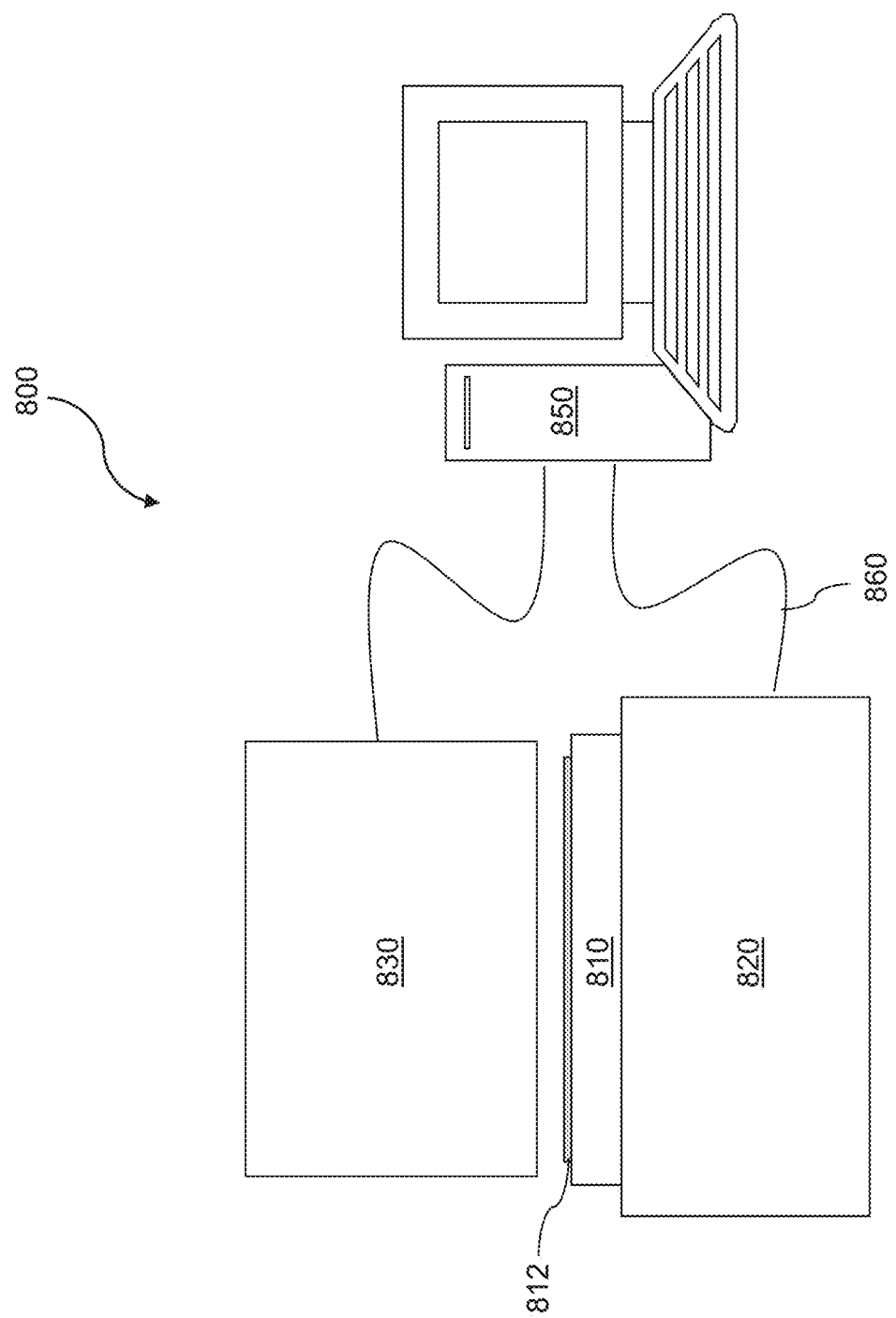
FIG. 4 is a schematic view of a height profile measurement apparatus that may be used to measure the height profiles of the exemplary structures of FIGS. 2A, 2B, and 3.

Referring to FIG. 4, an exemplary height profile measurement apparatus 800 is illustrated, which may be used to measure the height profiles of the exemplary structures of FIGS. 2A, 2B, and 3. The exemplary height profile measurement apparatus 800 may comprise a wafer chuck 810 configured to hold a wafer 812 that include the exemplary structure illustrated in FIGS. 2A and 2B or in FIG. 3, a platform 820 configured to hold and move the wafer chuck 810, and a measurement head 830 overlying the wafer chuck and perform height profile measurements. A computer 850 including a first data storage unit or in communication with the first data storage unit may be configured to control operation of the wafer chuck 810, the platform 820, and the measurement head 830. Signal transmission means 860 such as electrical cables and/or wireless communication units may be provided to enable communication between the computer 850 and the wafer chuck 810, the platform 820, and the measurement head 830.

The height of selected points on the top surface of the metal line 10 may be measured using a profile measurement tool. In one embodiment, the profile measurement tool may use optical interferometry. For example, a laser beam generated within the optical profile measurement tool may be split into two laser beam, and may be directed such that one of the two laser beams may be reflected off the surface of a measurement point on the top surface of the metal line 10, and another of the two laser beams may be reflected off a top surface of a portion of the pad-level dielectric material layer (such as the fourth interconnect-level dielectric material layer 640) that is adjacent to the metal line 10. The ratio of the intensity of the two laser beams may be adjusted until the interferometric effects of the two laser beams is maximized. Alternatively, the profile measurement tool may comprise a white light interferometry tool.

In an alternative embodiment, the height of selected points on the top surface of the metal line 10 may be measured using a height measurement tool using a stylus that scans across the top surface of the at least one metal line 10. For example, a profilometer using a stylus may be used to measure the height profile of the top surface of the metal line 10. In one embodiment, an atomic force microscopy (AFM) tool may be employed to measure the height profile of the at least one metal line 10.

The data on the height profile of the top surface of the metal line 10 may be subsequently stored in a first data storage unit, which may be a centralized data storage unit or a local data storage unit in communication with other data storage units and/or computers controlling such other data storage units.

Figure 5:
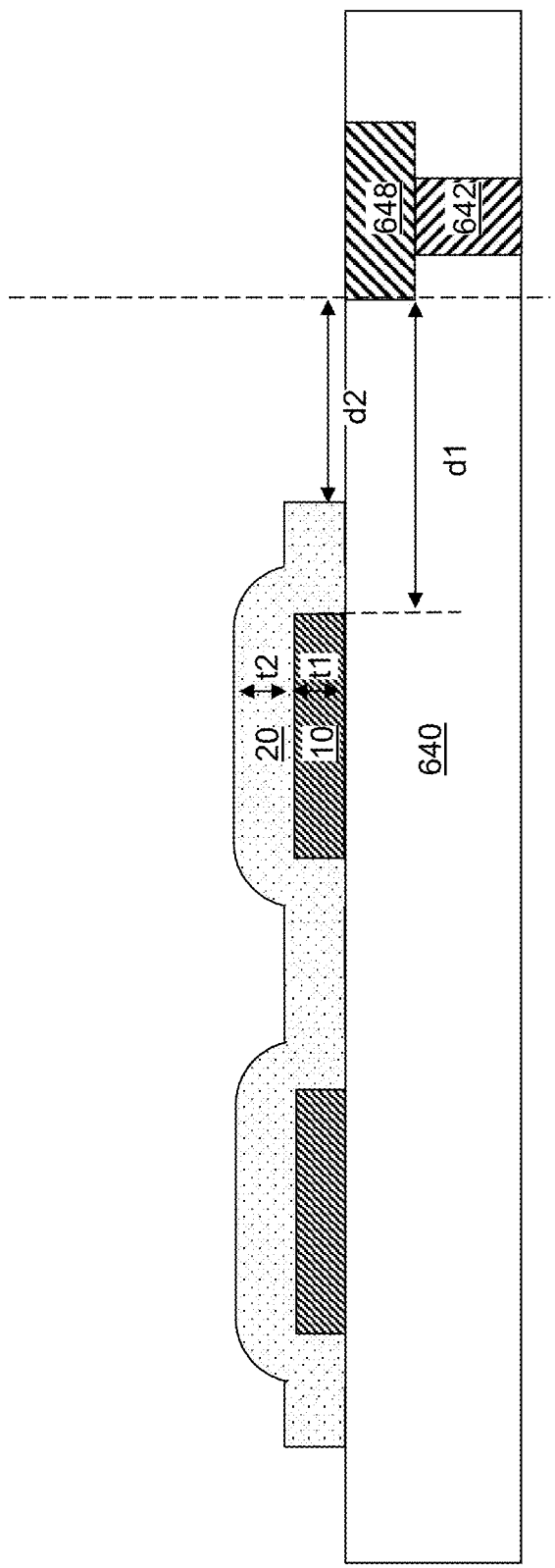
FIG. 5 is a vertical cross-sectional view of a region of the exemplary intermediate structure after formation of a polymer layer according to an embodiment of the present disclosure.

Referring to FIG. 5, a polymer layer 20 may be formed over the metal line 10, for example, by depositing a blanket (unpatterned) polymer layer and by patterning the blanket polymer layer. A remaining patterned portion of the blanket polymer layer constitutes the polymer layer 20. The blanket polymer layer may be formed by a conformal or non-conformal deposition process. In some embodiments, the polymer layer 20 may be formed by a self-planarizing or partially-self-planarizing process such as a spin-coating process. The blanket polymer layer may include a photosensitive material or a non-photosensitive material, and may be patterned by direct lithographic exposure and development, or by application and patterning of a photoresist layer thereupon and by subsequent transfer of the pattern in the photoresist layer into the blanket polymer layer using an etch process (which may comprise an anisotropic etch process (such as a reactive ion etch process) or an isotropic etch process (such as a wet etch process)).

In one embodiment, the polymer layer 20 may comprise a polymer material such as polyimide (PI), benzocyclobutene (BCB), or polybenzobisoxazole (PBO). In one embodiment, the polymer layer 20 may have a second thickness t2 (which is an average thickness) above the top surface of the metal line 10. The second thickness t2 may be in a range from 8 microns to 60 microns, such as from 10 microns to 40 microns and/or from 15 microns to 30 microns, although lesser and greater thicknesses may also be used. The polymer layer 20 may cover the entirety of the top surface and sidewall surfaces of the metal line 10. In one embodiment, the polymer layer 20 may be laterally spaced from the reference structure by a second lateral distance d2 that is less than the first lateral distance d1. For example, the second lateral distance may be in a range from 10 microns to 180 microns. For example, the reference structure may comprise a sidewall of a metal pad 648, and the second lateral distance d2 may be a lateral distance between a proximal lengthwise sidewall of the polymer layer 20 and the metal pad 648.

The height of selected points on the top surface of the polymer layer 20 may be measured using a profile measurement tool, which may be the same profile measurement tool used measure the height profile(s) of the metal line 10 or may be a different profile measurement tool. The data on the height profile of the top surface of the polymer layer 20 may be subsequently stored in the first data storage unit or a second data storage unit that is in communication with the first data storage units and/or computers controlling such the first data storage unit and the second data storage unit.

Generally, a height profile of a top surface of the polymer layer 20 may be directly measured as a function of the lateral displacement from the reference structure using a height profile measurement tool. The height profile of the top surface of the polymer layer 20 may be generated by direct measurement as a function of the lateral displacement from the reference structure. The data on a height profile of the top surface of the metal line 10 may be stored in a data storage unit, and the data on a height profile of the top surface of the polymer layer 20 may be stored in the same data storage unit or in a different data storage unit.

A thickness profile of the polymer layer 20 may be determined, i.e., may be calculated, by subtracting the height profile of the top surface of the metal line 10 from the height profile of the top surface of the polymer layer 20. In one embodiment, the calculation that calculates the thickness profile of the polymer layer 20 may be performed using a computer that is configured to retrieve the data on the height profile of the top surface of the metal line 10 and the data on the height profile of the top surface of the polymer layer 20, and is configured to perform a point-by-point subtraction operation. In this embodiment, the set of measurement points for the height profile of the top surface of the polymer layer 20 may have the same planar coordinates (such as (x, y) coordinates that are measured along two orthogonal horizontal directions) as the set of measurement points for the height profile of the top surface of the metal line 10. In one embodiment, each of the height profile of the top surface of the polymer layer 20 and the height profile of the top surface of the metal line 10 may include a respective set of measured height data for a set of (x, y) coordinates corresponding to a rectangular periodic grid.

Figure 6:
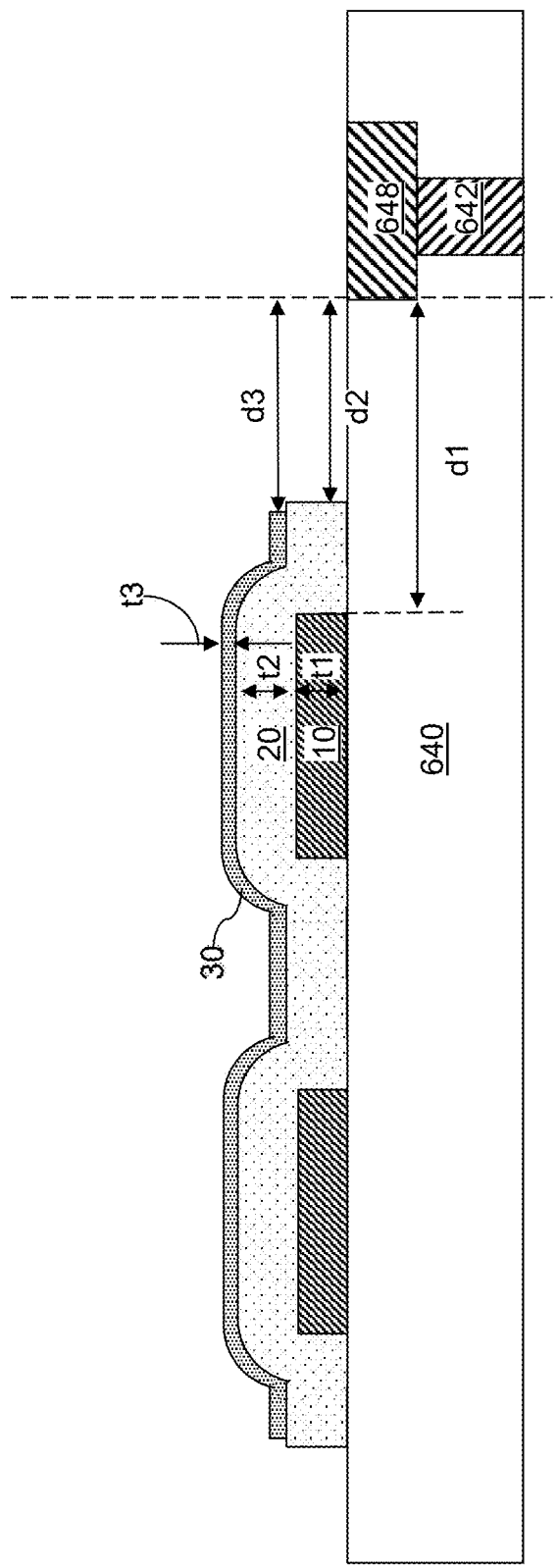
FIG. 6 is a vertical cross-sectional view of a region of the exemplary intermediate structure after formation of a passivation dielectric layer according to an embodiment of the present disclosure.

Referring to FIG. 6, a passivation dielectric layer 30 may be formed over the polymer layer 20, for example, by depositing a blanket (unpatterned) passivation dielectric layer and by patterning the blanket passivation dielectric layer. A remaining patterned portion of the blanket passivation dielectric layer constitutes the passivation dielectric layer 30. In one embodiment, the passivation dielectric layer 30 may comprise, and/or may consist essentially of, silicon nitride. Alternatively or additionally, the passivation dielectric layer 30 may comprise silicon carbide nitride.

In one embodiment, the passivation dielectric layer 30 may have a third thickness t3 (which is an average thickness) above the top surface of the polymer layer 20. The third thickness t3 may be in a range from 1 microns to 6 microns, such as from 2 microns to 4 microns, although lesser and greater thicknesses may also be used. The passivation dielectric layer 30 may cover the entirety of the top surface and sidewall surfaces of the polymer layer 20. In one embodiment, the passivation dielectric layer 30 may be laterally spaced from the reference structure by a third lateral distance d3 that may be less than the second lateral distance d2. For example, the third lateral distance d3 may be in a range from 5 microns to 160 microns. For example, the reference structure may comprise a sidewall of a metal pad 648, and the third lateral distance d3 may be a lateral distance between a proximal lengthwise sidewall of the passivation dielectric layer 30 and the metal pad 648.

The height of selected points on the top surface of the passivation dielectric layer 30 may be measured using a profile measurement tool, which may be the same profile measurement tool used measure the height profile(s) of the polymer layer 20 and/or the height profile(s) of the metal line 10, or may be a different profile measurement tool. The data on the height profile of the top surface of the passivation dielectric layer 30 may be subsequently stored in a data storage unit, which may be data storage unit that stores data on the height profile of the top surface of the metal line 10 and/or the polymer layer 20, or a storage unit that is in communication with such data storage units.

Generally, a height profile of a top surface of the passivation dielectric layer 30 may be measured as a function of the lateral displacement from the reference structure using a height profile measurement tool. The height profile of the top surface of the passivation dielectric layer 30 may be generated as a function of the lateral displacement from the reference structure. The data on a height profile of the top surface of the passivation dielectric layer 30 may be stored in the same data storage unit that stores data on the height profile of the top surface of the metal line 10 and/or the polymer layer 20, or in a different data storage unit.

A thickness profile of the passivation dielectric layer 30 may be determined, i.e., may be calculated, by subtracting the height profile of the top surface of the polymer layer 20 from the height profile of the top surface of the passivation dielectric layer 30. In one embodiment, the calculation of the thickness profile of the passivation dielectric layer 30 may be performed using a computer that may be configured to retrieve the data on the height profile of the top surface of the polymer layer 20 and the data on the height profile of the top surface of the passivation dielectric layer 30, and is configured to perform a point-by-point subtraction operation. In this embodiment, the set of measurement points for the height profile of the top surface of the passivation dielectric layer 30 may have the same planar coordinates (such as (x, y) coordinates that are measured along two orthogonal horizontal directions) as the set of measurement points for the height profile of the top surface of the polymer layer 20.

Additionally or alternatively, a vertical spacing profile between the top surface of the passivation dielectric layer 30 and the top surface of the metal line 10 may be determined, i.e., may be calculated, by subtracting the height profile of the top surface of the metal line 10 from the height profile of the top surface of the passivation dielectric layer 30. In one embodiment, the calculation of the thickness profile of the passivation dielectric layer 30 may be performed using a computer that may be configured to retrieve the data on the height profile of the top surface of the metal line 10 and the data on the height profile of the top surface of the passivation dielectric layer 30, and is configured to perform a point-by-point subtraction operation. In this embodiment, the set of measurement points for the height profile of the top surface of the passivation dielectric layer 30 may have the same planar coordinates (such as (x, y) coordinates that are measured along two orthogonal horizontal directions) as the set of measurement points for the height profile of the top surface of the metal line 10.

Figure 7:
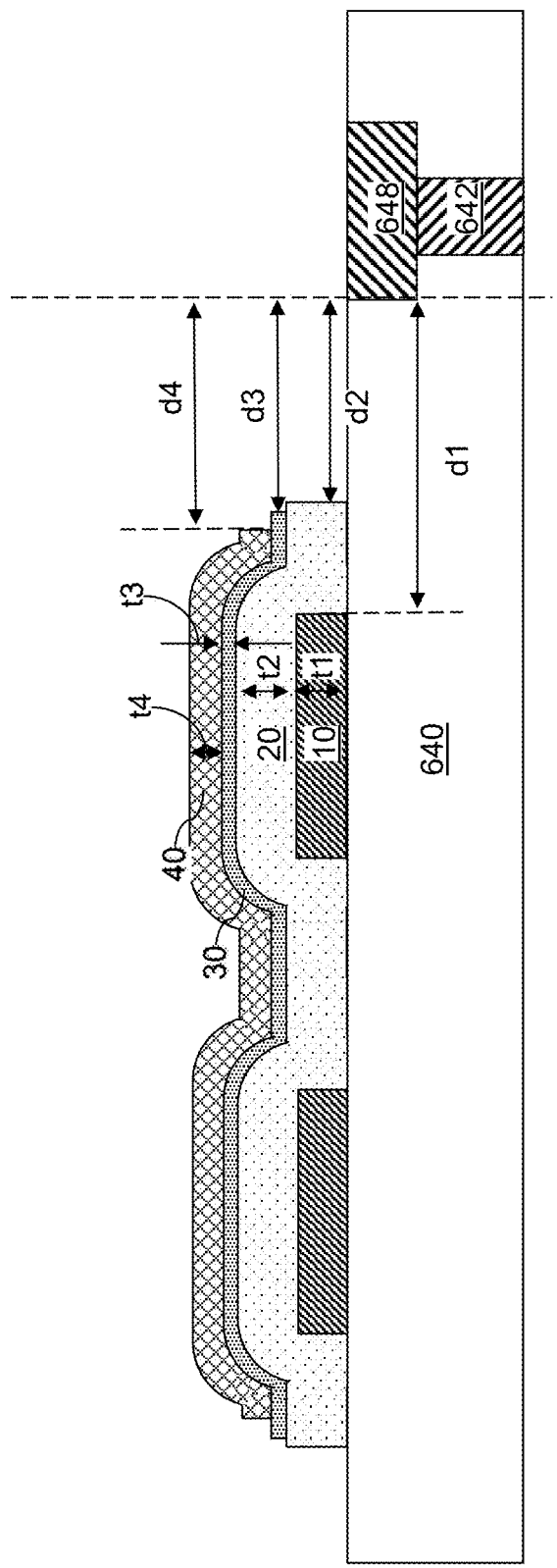
FIG. 7 is a vertical cross-sectional view of a region of the exemplary intermediate structure after formation of a magnetic material plate according to an embodiment of the present disclosure.

Referring to FIG. 7, a magnetic material plate 40 may be formed over the passivation dielectric layer 30, for example, by depositing a magnetic material layer and by patterning the magnetic material layer. The magnetic material layer may be deposited over the passivation dielectric layer 30 as a continuous material layer. The magnetic material layer may include a magnetic material including an elemental magnetic material or a magnetic alloy of at least two metals. In one embodiment, the magnetic material layer may comprise cobalt, zirconium, tantalum, iron, nickel, rare earth elements, or a combination thereof. In one embodiment, the magnetic material layer may comprise, and/or may consist essentially of, an alloy containing cobalt, zirconium, and tantalum (CZT), an alloy containing cobalt and zirconium, an alloy containing iron and nickel, one or more other suitable materials, or a combination thereof. The magnetic material layer may be formed by physical vapor deposition, chemical vapor deposition, electroplating, electroless plating, or a combination thereof. In one embodiment, the magnetic material layer comprises, and/or consists essentially of, a magnetic alloy of cobalt, zirconium, and tantalum.

A patterned etch mask layer (not shown) may be formed over the magnetic material layer. For example, the patterned etch mask layer may comprise a patterned photoresist layer. Unmasked portions of the magnetic material layer may be etched selective to the passivation dielectric layer 30 by performing an etch process that uses the patterned etch mask layer as an etch mask. The etch process may comprise an anisotropic etch process (such as a reactive ion etch process) or an isotropic etch process (such as a wet etch process). A remaining patterned portion of the blanket magnetic material plate constitutes the magnetic material plate 40. The patterned etch mask layer (such as a photoresist layer) may be removed, for example, by ashing.

Generally, a configuration of at least one metal line 10 (such as a patterned copper wire) surrounded by at least one magnetic material plate 40 can be formed. Each of the at least one metal line 10 may be surrounded by a respective magnetic material plate 40. In one embodiment, a plurality of metal lines 10 may be surrounded by a plurality of magnetic material plates 40. In another embodiment, a plurality of metal lines 10 may be surrounded by a common magnetic material plate 40. In one embodiment, a pair of parallel metal lines 10 may be positioned in proximity to each other, and may be covered by a common magnetic material plate 40. In one embodiment, a pair of parallel metal lines 10 may be configured to flow electrical current in opposite directions to maximize the inductance of the inductive structure. Any configuration of at least one metal line 10 and at least one magnetic material plate 40 that functions as an inductive structure may be employed. The width of each magnetic material plate 40 along a widthwise direction of an underlying metal line 10 may be in a range from 500 nm to 20 microns, such as from 1 micron to 10 microns, although lesser and greater widths may also be employed.

In one embodiment, the magnetic material plate 40 may have a fourth thickness t4 (which is an average thickness) above the top surface of the passivation dielectric layer 30. The fourth thickness t4 may be in a range from 2 microns to 10 microns, such as from 4 microns to 6 microns, although lesser and greater thicknesses may also be used. The magnetic material plate 40 may cover the entirety of the top surface and sidewall surfaces of the passivation dielectric layer 30. In one embodiment, the magnetic material plate 40 may be laterally spaced from the reference structure by a fourth lateral distance d4 that is less than the third lateral distance d3. For example, the fourth lateral distance d4 may be in a range from 2 microns to 140 microns. For example, the reference structure may comprise a sidewall of a metal pad 648, and the fourth lateral distance d4 may be a lateral distance between a proximal lengthwise sidewall of the magnetic material plate 40 and the metal pad 648.

The height of selected points on the top surface of the magnetic material plate 40 may be measured using a profile measurement tool, which may be the same profile measurement tool used measure the height profile(s) of the passivation dielectric layer 30, the polymer layer 20, and/or the metal line 10, or may be a different profile measurement tool. The data on the height profile of the top surface of the magnetic material plate 40 may be subsequently stored in a data storage unit, which may be data storage unit that stores data on the height profile of the top surface of the metal line 10, the polymer layer 20, and/or the passivation dielectric layer 30, or a storage unit that is in communication with such data storage units.

Generally, the lateral displacement from the reference structure may be measured as a two-dimensional array of displacement vectors, or as a lateral distance (which is a scalar, i.e., a one-dimensional quantity) from the reference structure. If the lateral displacement from the reference structure is measured as a two-dimensional array of displacement vectors, the height profile of a top surface of the magnetic material plate 40 is generated as a two-dimensional array of heights of measured points of the top surface of the magnetic material plate 40. In embodiments in which the lateral displacement from the reference structure is measured as a lateral distance from a reference structure on the top surface of the semiconductor die, the height profile of a top surface of the magnetic material plate 40 is generated as a function of the lateral displacement as a one-dimensional array of heights of measured points of the top surface of the magnetic material plate 40.

Generally, a height profile of a top surface of the magnetic material plate 40 may be measured as a function of the lateral displacement from the reference structure using a height profile measurement tool. The height profile of the top surface of the magnetic material plate 40 may be generated as a function of the lateral displacement from the reference structure. The data on a height profile of the top surface of the magnetic material plate 40 may be stored in the same data storage unit that stores data on the height profile of the top surface of the metal line 10, the polymer layer 20, and/or the passivation dielectric layer 30, or in a different data storage unit.

A thickness profile of the magnetic material plate 40 may be determined, i.e., may be calculated, by subtracting the height profile of the top surface of the passivation dielectric layer 30 from the height profile of the top surface of the magnetic material plate 40. In one embodiment, the calculation that calculates the thickness profile of the magnetic material plate 40 may be performed using a computer that may be configured to retrieve the data on the height profile of the top surface of the passivation dielectric layer 30 and the data on the height profile of the top surface of the magnetic material plate 40, and is configured to perform a point-by-point subtraction operation. In this embodiment, the set of measurement points for the height profile of the top surface of the magnetic material plate 40 may have the same planar coordinates (such as (x, y) coordinates that are measured along two orthogonal horizontal directions) as the set of measurement points for the height profile of the top surface of the passivation dielectric layer 30.

The combination of the metal line 10, the polymer layer 20, the passivation dielectric layer 30, and the magnetic material plate 40 constitutes an inductor structure, which may function as an inductor. An optional thermal anneal process and a magnetization process may be performed. The thermal anneal process may increase the average grain size in metal structures (such as the metal line 10 and the magnetic material plate 40) of the semiconductor die. The magnetization process may magnetize the magnetic material of the magnetic material plate 40 such that magnetic flux is generated around, through, and/or within, the area defined by the metal line 10.

Figure 8:
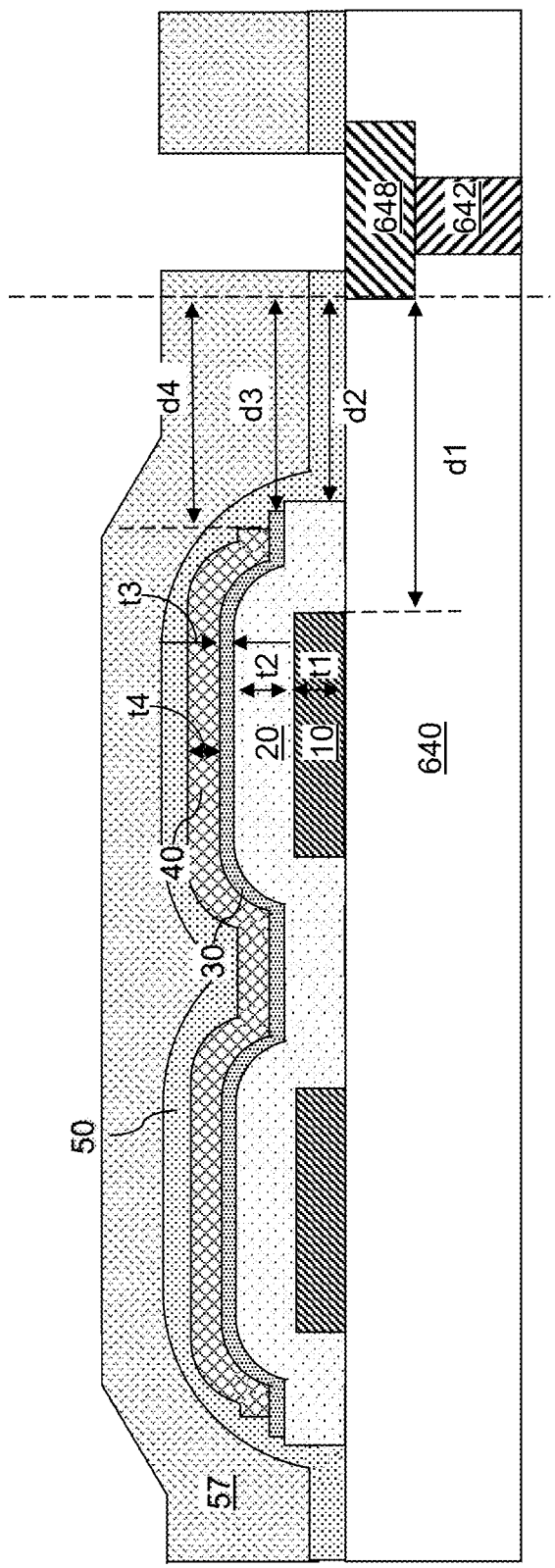
FIG. 8 is a vertical cross-sectional view of a region of the exemplary intermediate structure after formation of a capping passivation layer and a photoresist layer, and formation of openings therethrough according to an embodiment of the present disclosure.

Referring to FIG. 8, a capping passivation layer 50 and a photoresist layer 57 may be formed above the magnetic material plate 40 and the physically exposed surfaces of the pad-level dielectric material layer. The capping passivation layer 50 includes a dielectric material that may block diffusion of moisture and/or metallic impurities therethrough. For example, the capping passivation layer 50 may comprise silicon nitride and/or silicon carbide nitride. The thickness of the capping passivation layer 50 may be in a range from 100 nm to 1 micron, although lesser and greater thicknesses may also be used.

The thickness of the photoresist layer 57 may be in a range from 10 microns to 40 microns. In one embodiment, the photoresist layer 57 may comprise a photosensitive polyimide material. The photoresist layer 57 may be lithographically patterned to form openings over areas of the metal pads 648. In one embodiment, the periphery of an opening in the photoresist layer 57 may be entirely within the periphery of an underlying metallic pad 648 in a top-down view.

Figure 9:
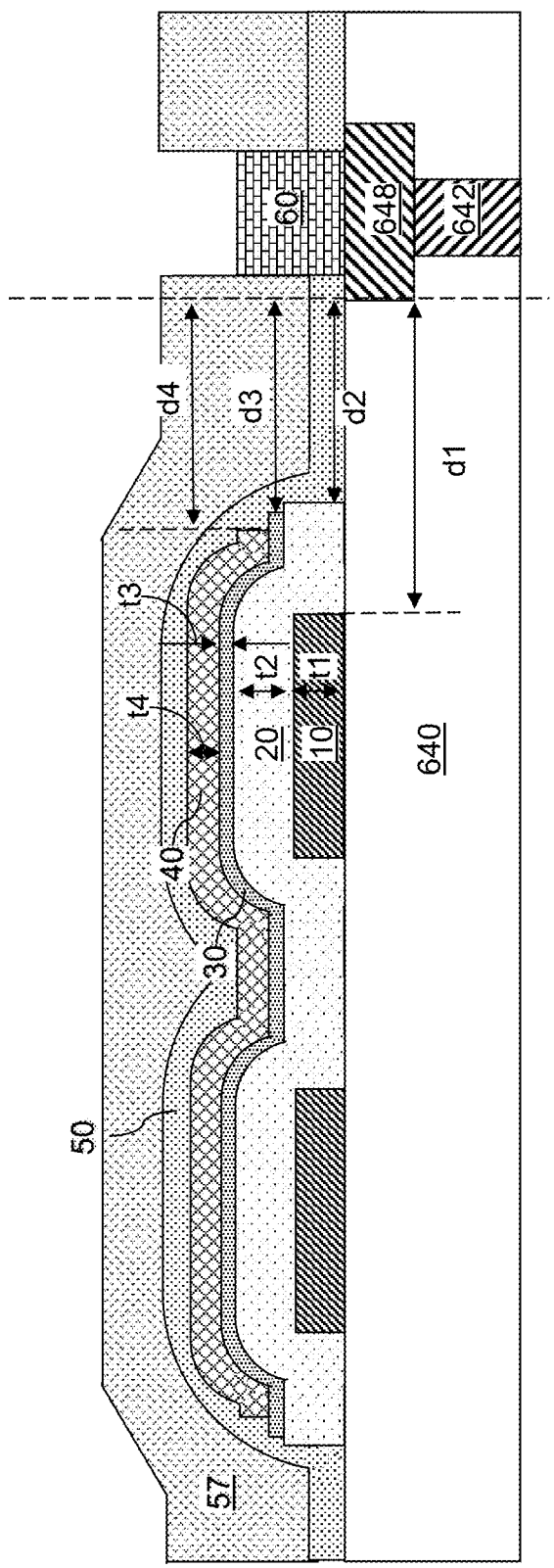
FIG. 9 is a vertical cross-sectional view of a region of the exemplary intermediate structure after formation of metal bump structures according to an embodiment of the present disclosure.

Referring to FIG. 9, an electroplating process may be performed to electroplate a metal bump structure 60 directly on each physically exposed surface of the metal pads 648. An array of metal bump structures 60 may be formed on the array of metal pads 648. In one embodiment, the metal bump structures 60 may consist essentially of copper, and may comprise copper bump structures. Each metal bump structure 60 may have a lateral dimension (such as a diameter) in a range from 5 microns to 60 microns, such as from 10 microns to 30 microns. The height of the metal bump structures 60 may be in a range from 5 micron to 40 microns, such as from 10 microns to 30 microns, although lesser and greater heights may also be used. Generally, the metal bump structures 60 may be formed on the top surface of the semiconductor die after formation of the magnetic material plate 40.

Figure 10:
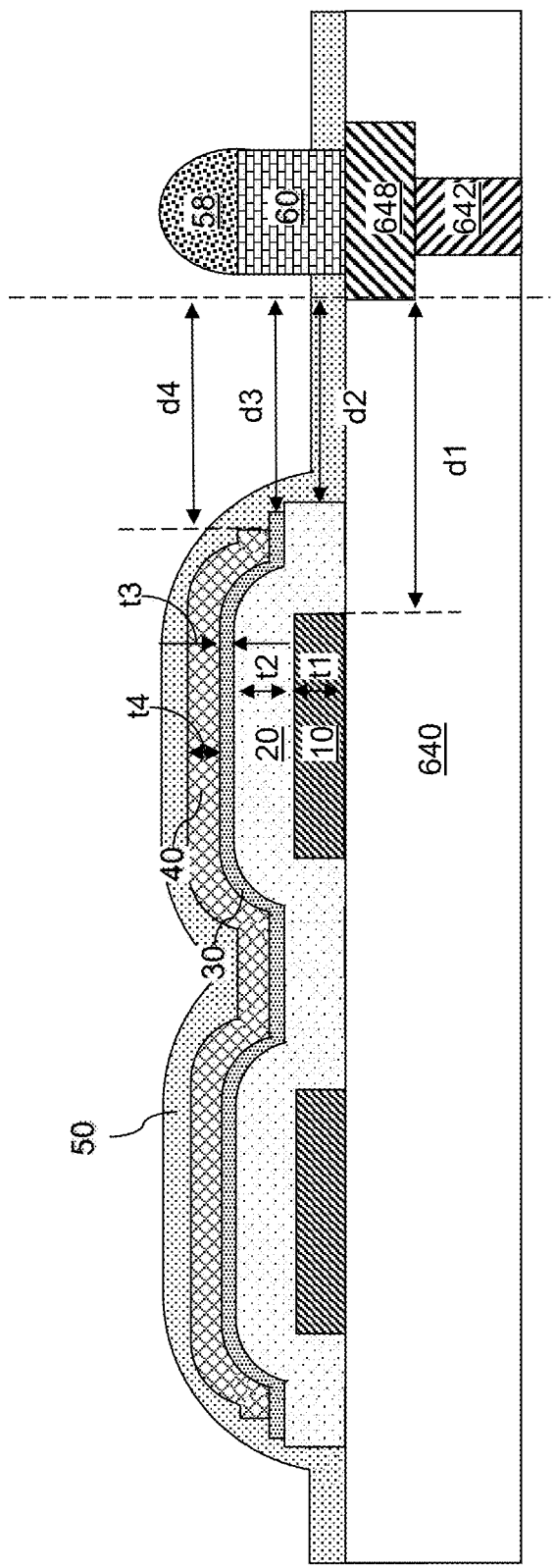
FIG. 10 is a vertical cross-sectional view of a region of the exemplary structure after attaching solder material portions to the metal bump structures according to an embodiment of the present disclosure.

Referring to FIG. 10, the photoresist layer 57 may be removed from above the semiconductor die, for example, by ashing. A solder material portion 58 may be formed on each of the metal bump structures 60. The semiconductor die may be subsequently attached to another structure such as a redistribution structure, a packaging substrate, or a printed circuit board (PCB) using the array of solder material portions 58.

Figure 11:
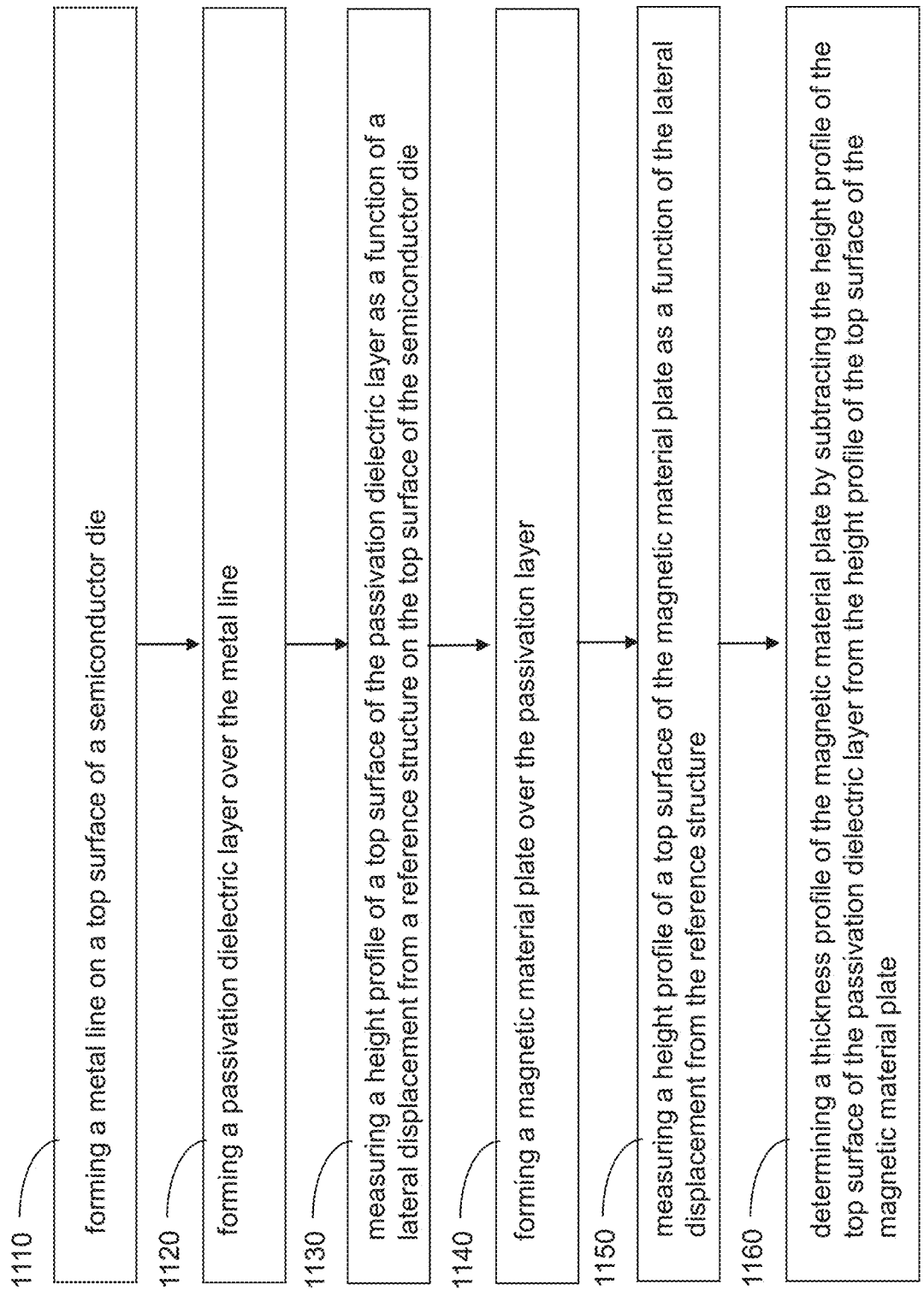
FIG. 11 is a first flowchart that illustrates a first set of processing steps that may be used to manufacture the semiconductor device of the present disclosure.

Referring to FIG. 11, a first flowchart illustrates a first set of processing steps that may be used to manufacture a semiconductor device of the present disclosure.

Referring to step 1110 and FIGS. 1, 2A, 2B, and 3, a metal line 10 may be formed on a top surface of a semiconductor die.

Referring to step 1120 and FIGS. 4, 5, and 6, a passivation dielectric layer 30 may be formed over the metal line 10.

Referring to step 1130 and FIGS. 4, 5, and 6, a height profile of a top surface of the passivation dielectric layer 30 may be generated, by measurement, as a function of a lateral displacement from a reference structure on the top surface of the semiconductor die.

Referring to step 1140 and FIG. 7, a magnetic material plate 40 may be formed over the passivation dielectric layer 30.

Referring to step 1150 and FIGS. 4 and 7, a height profile of a top surface of the magnetic material plate 40 may be generated, by measurement, as a function of the lateral displacement from the reference structure.

Referring to step 1160 and FIGS. 4 and 7, a thickness profile of the magnetic material plate 40 may be determined, by calculation, by subtracting the height profile of the top surface of the passivation dielectric layer 30 from the height profile of the top surface of the magnetic material plate 40.

Figure 12:
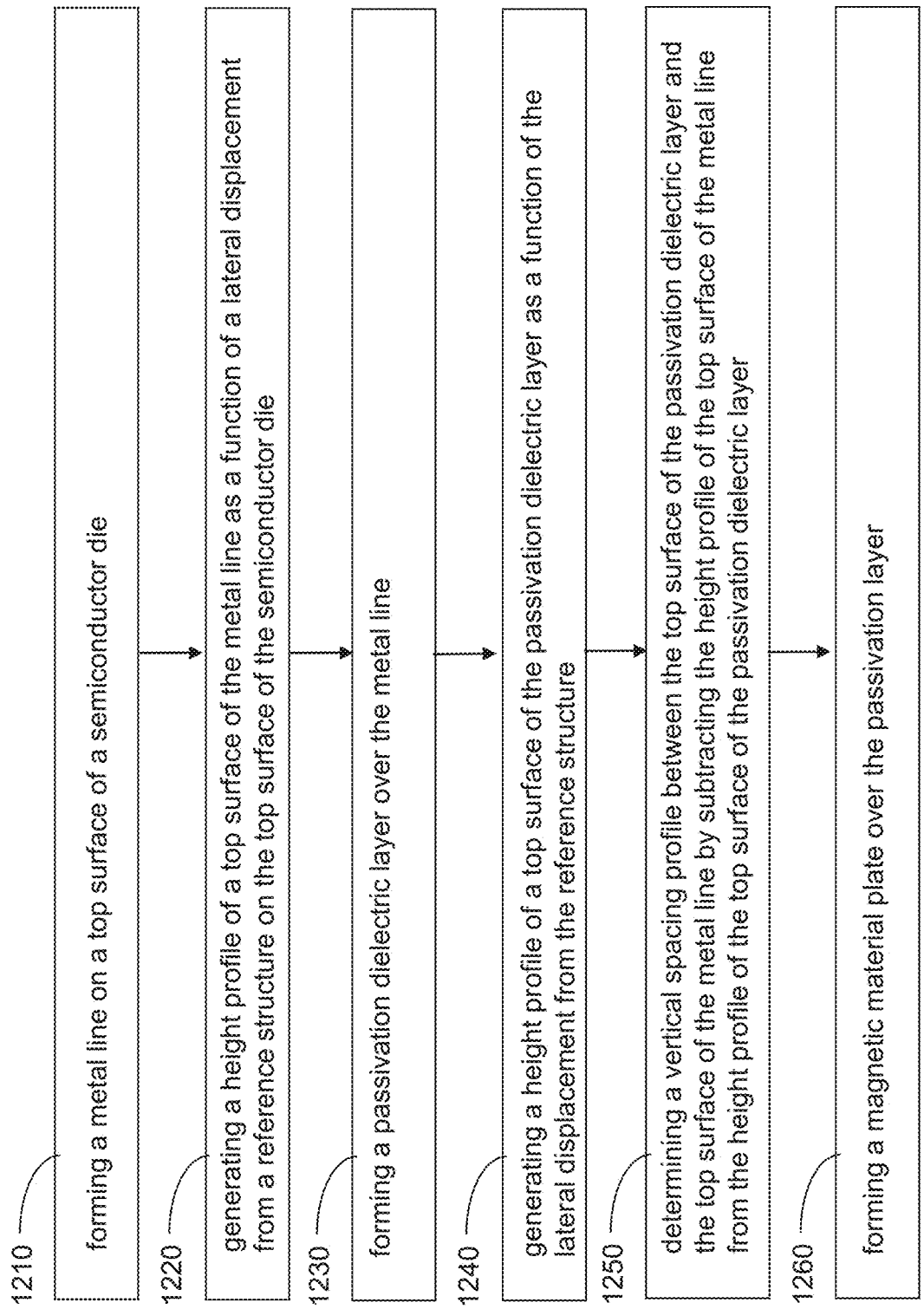
FIG. 12 is a second flowchart that illustrates a second set of processing steps that may be used to manufacture the semiconductor device of the present disclosure.

Referring to FIG. 12, a second flowchart illustrates a second set of processing steps that may be used to manufacture a semiconductor device of the present disclosure.

Referring to step 1210 and FIGS. 1, 2A, 2B, and 3, a metal line 10 may be formed on a top surface of a semiconductor die.

Referring to step 1220 and FIGS. 2A, 2B, 3, and 4, a height profile of a top surface of the metal line 10 may be generated as a function of a lateral displacement from a reference structure on the top surface of the semiconductor die by a first height profile measurement.

Referring to step 1230 and FIGS. 4, 5, and 6, a passivation dielectric layer 30 may be formed over the metal line 10.

Referring to step 1240 and FIGS. 4, 5, and 6, a height profile of a top surface of the passivation dielectric layer 30 may be generated as a function of the lateral displacement from the reference structure by a second height profile measurement.

Referring to step 1250 and FIGS. 4, 5, and 6, a vertical spacing profile between the top surface of the passivation dielectric layer 30 and the top surface of the metal line 10 may be determined, by calculation, by subtracting the height profile of the top surface of the metal line 10 from the height profile of the top surface of the passivation dielectric layer 30.

Referring to step 1260 and FIG. 7, a magnetic material plate 40 may be formed over the passivation dielectric layer 30.

Figure 13:
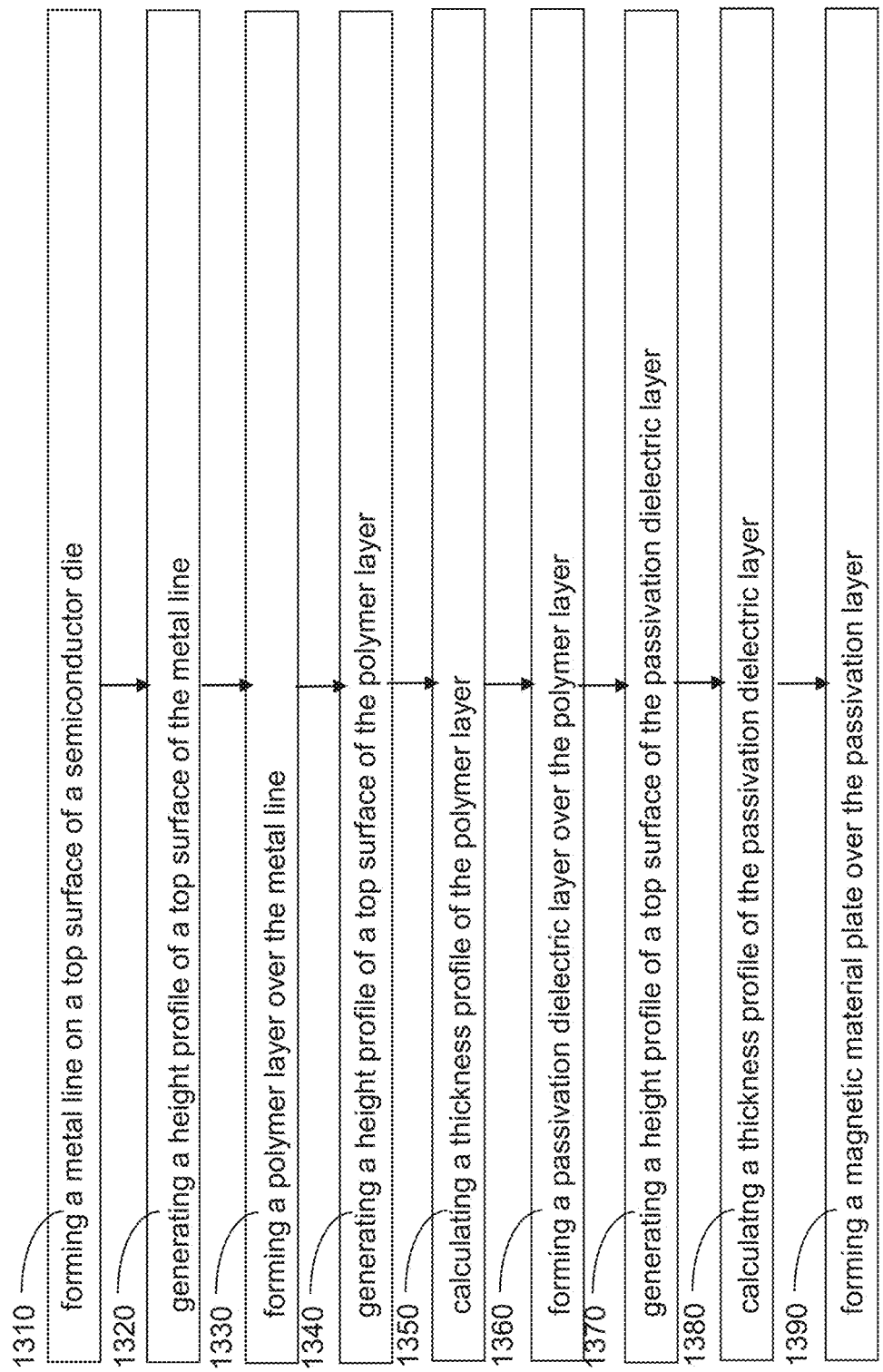
FIG. 13 is a third flowchart that illustrates a third set of processing steps that may be used to manufacture the semiconductor device of the present disclosure.

Referring to FIG. 13, a third flowchart illustrates a third set of processing steps that may be used to manufacture a semiconductor device of the present disclosure.

Referring to step 1310 and FIGS. 1, 2A, 2B, and 3, a metal line 10 may be formed on a top surface of a semiconductor die.

Referring to step 1320 and FIGS. 2A, 2B, 3, and 4, a height profile of a top surface of the metal line 10 may be generated, by measurement, as a function of a lateral displacement from a reference structure on the top surface of the semiconductor die.

Referring to step 1330 and FIG. 5, a polymer layer 20 may be formed over the metal line 10.

Referring to step 1340 and FIGS. 4 and 5, a height profile of a top surface of the polymer layer 20 may be generated, by measurement, as a function of the lateral displacement from the reference structure.

Referring to step 1350 and FIGS. 4 and 5, a thickness profile of the polymer layer 20 may be generated, by calculation, by subtracting the height profile of the top surface of the metal line 10 from the height profile of the top surface of the polymer layer 20.

Referring to step 1360 and FIG. 6, a passivation dielectric layer 30 may be formed over the polymer layer 20.

Referring to step 1370 and FIGS. 4 and 6, a height profile of a top surface of the passivation dielectric layer 30 may be generated, by measurement, as a function of the lateral displacement from the reference structure.

Referring to step 1380 and FIGS. 4 and 6, a thickness profile of the passivation dielectric layer 30 may be generated, by calculation, by subtracting the height profile of the top surface of the polymer layer 20 from the height profile of the top surface of the passivation dielectric layer 30.

Referring to step 1390 and FIG. 7, a magnetic material plate 40 may be formed over the passivation dielectric layer 30.

The various embodiments of the present disclosure may be used to generate vertical cross-sectional profiles of top surfaces and bottom surfaces of various elements in an inductive structure including a metal line 10, an optional polymer layer 20, a passivation dielectric layer 30, and a magnetic material plate 40. Further, thickness profiles of various elements in the inductive structure and various vertical spacing profiles between elements in the inductive structure may be determined in-line during manufacture of the inductive structure. Process parameters of later processing steps (such as the deposition steps that form the passivation dielectric layer 30 and the magnetic material layer) may be adjusted based on the measured thickness profiles and vertical spacing profiles of previously formed structures. For example, the thickness of the magnetic material layer (such as the thickness of the magnetic material plate 40) may be adjusted based on the measured thickness profiles of the passivation dielectric layer 30, the polymer layer 20, and/or the metal line 10 so that the inductance of the inductive structure is within specification upon completion of manufacture of the inductive structure. Thus, the methods of the present disclosure provide enhanced control for the inductance of manufactured inductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an inductive structure, the method comprising:
    forming a metal line on a top surface of a semiconductor die;
    forming a passivation dielectric layer over the metal line;
    measuring a height profile of a top surface of the passivation dielectric layer as a function of a lateral displacement from a reference structure on the top surface of the semiconductor die;
    forming a magnetic material plate over the passivation dielectric layer;
    measuring a height profile of a top surface of the magnetic material plate as a function of the lateral displacement from the reference structure; and
    determining a thickness profile of the magnetic material plate by subtracting the height profile of the top surface of the passivation dielectric layer from the height profile of the top surface of the magnetic material plate.

2. The method of claim 1, further comprising:
    measuring a height profile of a top surface of the metal line as a function of the lateral displacement from the reference structure; and
    generating the thickness profile of the magnetic material plate by subtracting the height profile of the top surface of the passivation dielectric layer from the height profile of the top surface of the magnetic material plate, wherein an inductive structure comprising the magnetic material plate and the metal line is formed.

3. The method of claim 2, wherein the magnetic material plate is formed by:
    depositing a magnetic material layer over the passivation dielectric layer as a continuous material layer;
    forming a patterned etch mask layer over the magnetic material layer; and
    etching unmasked portions of the magnetic material layer selective to the passivation dielectric layer using the patterned etch mask layer as an etch mask, wherein a remaining portion of the magnetic material layer comprises the magnetic material plate.

4. The method of claim 1, wherein:
    the lateral displacement from the reference structure is measured as a two-dimensional array of displacement vectors; and
    the thickness profile of the magnetic material plate is generated as a two-dimensional array of calculated thickness of the magnetic material plate.

5. The method of claim 1, wherein:
    the lateral displacement from the reference structure is measured as a lateral distance from the reference structure; and
    the thickness profile of the magnetic material plate comprises a one-dimensional array of calculated thickness of the magnetic material plate.

6. The method of claim 1, further comprising:
    forming a polymer layer over the metal line; and
    measuring a height profile of a top surface of the polymer layer as a function of the lateral displacement from the reference structure,
    wherein the passivation dielectric layer is formed over the polymer layer.

7. The method of claim 6, further comprising determining a thickness profile of the polymer layer by subtracting the height profile of the top surface of the metal line from the height profile of the top surface of the polymer layer.

8. The method of claim 1, wherein:
    the metal line comprises copper at an atomic percentage greater than 95%;
    the passivation dielectric layer comprises silicon nitride; and
    the magnetic material plate comprises a magnetic alloy of cobalt, zirconium, and tantalum.

9. The method of claim 1, wherein:
    the metal line has a thickness in a range from 5 microns to 40 microns; and
    the magnetic material plate has a thickness in a range from 2 micron to 10 microns.

10. The method of claim 1, wherein:
    the semiconductor die comprises a dielectric material layer embedding metal pads; and
    end portions of the metal line are formed directly on top surfaces of two of the metal pads.

11. The method of claim 1, further comprising forming metal bump structures on the top surface of the semiconductor die after formation of the magnetic material plate.

12. The method of claim 1, wherein:
    the metal line has a length that is at least 5 times a width of the metal line; and
    the height profile of the top surface of the passivation dielectric layer and the height profile of the top surface of the magnetic material plate are measured using a respective height profile measurement tool.

13. The method of claim 1, further comprising:
    storing data on the height profile of the top surface of the passivation dielectric layer in a first data storage unit;
    storing data on the height profile of the top surface of the magnetic material plate in the first data storage unit or in a second data storage unit; and
    performing a calculation that calculates the thickness profile of the magnetic material plate using a computer that is configured to retrieve the data on the height profile of the top surface of the passivation dielectric layer and the data on the height profile of the top surface of the magnetic material plate and is configured to perform a point-by-point subtraction operation.

14. A method of manufacturing an inductive structure, the method comprising:

forming a metal line on a top surface of a semiconductor die;

generating a height profile of a top surface of the metal line as a function of a lateral displacement from a reference structure on the top surface of the semiconductor die by performing a surface height measurement;

forming a passivation dielectric layer over the metal line;

measuring a height profile of a top surface of the passivation dielectric layer as a function of the lateral displacement from the reference structure;

forming a magnetic material plate over the passivation dielectric layer;

measuring a height profile of a top surface of the magnetic material plate as a function of the lateral displacement from the reference structure; and determining a thickness profile of the magnetic material plate by subtracting the height profile of the top surface of the passivation dielectric layer from the height profile of the top surface of the magnetic material plate.

15. The method of claim 14, further comprising determining a vertical spacing profile between the top surface of the passivation dielectric layer and the top surface of the metal line by subtracting the height profile of the top surface of the metal line from the height profile of the top surface of the passivation dielectric layer.

16. The method of claim 14, wherein the magnetic material plate is formed by:

depositing a magnetic material layer over the passivation dielectric layer as a continuous material layer;

forming a patterned etch mask layer over the magnetic material layer; and etching unmasked portions of the magnetic material layer selective to the passivation dielectric layer using the patterned etch mask layer as an etch mask, wherein a remaining portion of the magnetic material layer comprises the magnetic material plate.

17. The method of claim 14, further comprising:

forming a polymer layer over the metal line; and measuring a height profile of a top surface of the polymer layer as a function of the lateral displacement from the reference structure, wherein the passivation dielectric layer is formed over the polymer layer.

18. The method of claim 17, further comprising:

determining a thickness profile of the polymer layer by subtracting the height profile of the top surface of the metal line from the height profile of the top surface of the polymer layer; and determining a thickness profile of the passivation dielectric layer by subtracting the height profile of the top surface of the polymer layer from the height profile of the top surface of the passivation dielectric layer.

19. A method of manufacturing an inductive structure, the method comprising:

forming a metal line on a top surface of a semiconductor die;

forming a polymer layer over the metal line;

generating a height profile of a top surface of the polymer layer as a function of the lateral displacement from a reference structure on the top surface of the semiconductor die;

forming a passivation dielectric layer over the metal line;

measuring a height profile of a top surface of the passivation dielectric layer as a function of a lateral displacement from the reference structure;

forming a magnetic material plate over the passivation dielectric layer;

measuring a height profile of a top surface of the magnetic material plate as a function of the lateral displacement from the reference structure; and determining a thickness profile of the magnetic material plate by subtracting the height profile of the top surface of the passivation dielectric layer from the height profile of the top surface of the magnetic material plate.

20. The method of claim 19, wherein:

the lateral displacement from the reference structure is measured as a two-dimensional array of displacement vectors; and the thickness profile of the magnetic material plate is generated as a two-dimensional array of calculated thickness of the magnetic material plate.

* * * * *